(12) United States Patent
Destain (10) Patent No.: US 7,798,678 B2
(45) Date of Patent: Sep. 21, 2010

(54) LED WITH COMPOUND ENCAPSULANT LENS

(75) Inventor: Patrick R. Destain, Loveland, OH (US)

(73) Assignee: 3M Innovative Properties Company, St. Paul, MN (US)

( * ) Notice: Subject to any disclaimer, the term of this patent is extended or adjusted under 35 U.S.C. 154(b) by 484 days.

(21) Appl. No.: 11/322,801

(22) Filed: Dec. 30, 2005

(65) Prior Publication Data

US 2007/0152231 A1 Jul. 5, 2007

(51) Int. Cl.
*F21V 3/00* (2006.01)
*F21V 5/00* (2006.01)

(52) U.S. Cl. .................. 362/311.02; 362/331; 362/335; 362/336; 362/268; 362/800

(58) Field of Classification Search .............. 362/800, 362/268, 335, 336, 331
See application file for complete search history.

(56) References Cited

U.S. PATENT DOCUMENTS

| | | | |
|---|---|---|---|
| 3,510,732 A | 5/1970 | Amans | |
| 3,596,136 A | 7/1971 | Fischer | |
| 4,337,759 A | 7/1982 | Popovich et al. | |
| 4,712,163 A * | 12/1987 | Oxley | 362/800 |
| 5,403,773 A | 4/1995 | Nitta et al. | |
| 5,404,869 A | 4/1995 | Parkyn, Jr. et al. | |
| 5,577,493 A | 11/1996 | Parkyn, Jr. et al. | |
| 5,777,433 A | 7/1998 | Lester et al. | |
| 5,785,404 A | 7/1998 | Wiese | |
| 5,796,487 A | 8/1998 | Guerra | |
| 5,813,753 A | 9/1998 | Vriens et al. | |
| 5,882,774 A | 3/1999 | Jonza et al. | |
| 5,898,524 A | 4/1999 | Ryzhikov | |
| 5,959,316 A | 9/1999 | Lowery | |

(Continued)

FOREIGN PATENT DOCUMENTS

JP 2004-172806 6/2004

(Continued)

OTHER PUBLICATIONS

Conner et al., "Performance of LED as the Illumination Source for Microdisplay Rear Projection TV", IDW/AD '05, Proceedings of the 12th International Display Workshops in conjunction with Asia Display 2005, vol. 2, Dec. 6-9, 2005.

(Continued)

*Primary Examiner*—Sandra L O'Shea
*Assistant Examiner*—William J Carter (57) ABSTRACT

An LED light source includes an LED emitter and an encapsulant that at least partially surrounds the emitter. The encapsulant includes an inner lens and an outer lens, the inner lens having a refractive index less than, and in some cases about 70 to 80% of, the refractive index of the outer lens. The inner lens and outer lens can contact each other along a curved surface, and in some cases the inner lens is substantially plano-convex and the outer lens is meniscus. The inner lens produces a first virtual image of the emitter and the outer lens produces a second virtual image, and the first virtual image is disposed between the emitter and the second virtual image. The LED light source is capable of providing uniform illumination in a compact space.

25 Claims, 5 Drawing Sheets

U.S. PATENT DOCUMENTS

| | | | |
|---|---|---|---|
| 6,155,699 | A | 12/2000 | Miller et al. |
| 6,424,099 | B1 | 7/2002 | Kirkpatrick et al. |
| 6,483,196 | B1 | 11/2002 | Wojnarowski et al. |
| 6,560,038 | B1 | 5/2003 | Parkyn, Jr. et al. |
| 6,635,363 | B1 | 10/2003 | Duclos et al. |
| 6,653,551 | B2 | 11/2003 | Chen |
| 6,686,676 | B2 | 2/2004 | McNulty et al. |
| 6,717,362 | B1 | 4/2004 | Lee et al. |
| 6,821,804 | B2 | 11/2004 | Thibeault et al. |
| 6,841,096 | B2 | 1/2005 | Quake et al. |
| 6,871,982 | B2 | 3/2005 | Holman et al. |
| 6,895,145 | B2 | 5/2005 | Ho |
| 6,896,381 | B2 | 5/2005 | Benitez et al. |
| 6,897,486 | B2 | 5/2005 | Loh |
| 6,916,440 | B2 | 7/2005 | Jackson et al. |
| 6,936,209 | B2 | 8/2005 | Jackson et al. |
| 6,939,499 | B2 | 9/2005 | Merrill et al. |
| 6,949,212 | B2 | 9/2005 | Merrill et al. |
| 6,959,130 | B2 | 10/2005 | Fauver et al. |
| 6,961,190 | B1 * | 11/2005 | Tamaoki et al. ............. 359/726 |
| 7,038,856 | B2 * | 5/2006 | Quake et al. ................ 359/661 |
| 2004/0080939 | A1 * | 4/2004 | Braddell et al. ............. 362/800 |
| 2004/0145288 | A1 | 7/2004 | Ouderkirk et al. |
| 2005/0174775 | A1 | 8/2005 | Conner |
| 2005/0179041 | A1 | 8/2005 | Harbers et al. |
| 2005/0201118 | A1 * | 9/2005 | Godo ......................... 362/800 |
| 2006/0083000 | A1 | 4/2006 | Yoon et al. |
| 2007/0064417 | A1 * | 3/2007 | Hatanaka et al. ............ 362/231 |

FOREIGN PATENT DOCUMENTS

| | | |
|---|---|---|
| KR | 10-2005-0031143 | 4/2005 |
| WO | WO 01/33598 | 5/2001 |
| WO | WO 02/07228 | 1/2002 |
| WO | WO 03/069685 | 8/2003 |
| WO | WO 2004/068602 | 8/2004 |
| WO | WO 2005/027576 | 3/2005 |
| WO | WO 2007/042711 | 4/2007 |

OTHER PUBLICATIONS

Smith, Warren J., Modern Optical Engineering; The Design of Optical Systems, Table of Contents, pp. 24-33, 363-368, 1977.

Parkyn, William A., and Pelka, David G., "Uniformly illuminating dual-lens system for LED collimation", pp. 232-238, Proceedings of SPIE, vol. 4446, 2002.

U.S. Application entitled "Polarizing Beam Splitter", filed Jul. 29, 2005, having U.S. Appl. No. 11/192,655.

U.S. Application entitled "Projection System with Beam Homogenizer", filed Dec. 30, 2005, having U.S. Appl. No. 11/322,958.

* cited by examiner

LED WITH COMPOUND ENCAPSULANT LENS

FIELD OF THE INVENTION

The present invention relates to light emitting diode (LED) devices, components therefor, and related articles and processes.

BACKGROUND

LEDs are a desirable choice of light source in part because of their relatively small size, low power/current requirements, rapid response time, long life, robust packaging, variety of available output wavelengths, and compatibility with modern circuit construction. These characteristics may help explain their widespread use over the past few decades in a multitude of different end use applications. Improvements to LEDs continue to be made in the areas of efficiency, brightness, and output wavelength, further enlarging the scope of potential end-use applications.

LEDs are typically sold in a packaged form that includes an LED die or chip mounted on a metal header. The header can have a reflective cup in which the LED die is mounted, and electrical leads connected to the LED die. Some packages also include a molded transparent resin that encapsulates the LED die. The encapsulating resin can have either a nominally hemispherical front surface to partially collimate light emitted from the die, or a nominally flat surface.

Examples of known LED sources are given in FIGS. 1-5.

Figure 1:
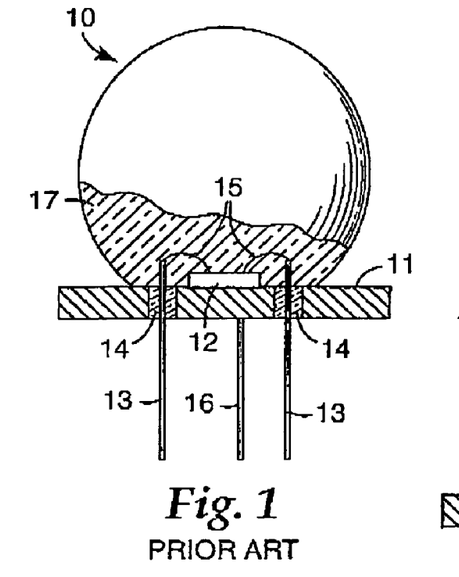
FIGS. 1-5 are schematic sectional views of known LED light sources.
Figure 2:
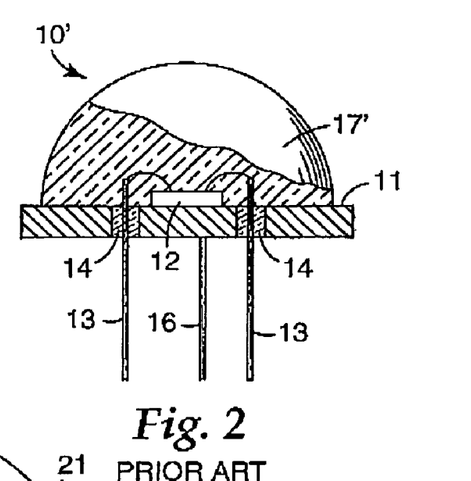

In FIG. 1, an optical semiconductor device 10 includes a support 11 and an electroluminescent semiconductor diode 12 secured to a top surface of support 11 by a suitable solder. Terminal wires 13, which extend through openings in the support 11, are secured to and electrically insulated from the support by washers 14 of an electrically insulating material, such as glass or ceramic. Each terminal wire 13 is electrically connected to a separate contact of the diode 12 by a fine wire 15. A third terminal wire 16 is secured to the support 11 which is electrically connected to the diode 12. A glass dome 17 is mounted on and secured to the top surface of support 11. The glass dome extends over and is in intimate contact with the diode 12 so that radiation emitted by the diode passes through the glass dome. In device 10 of FIG. 1, the glass dome is nearly spherical in shape. FIG. 2 shows an optical semiconductor device 10' similar to device 10 except that the glass dome 17' of FIG. 2, which is mounted on the support 11 and covers the diode 12, is hemispherical in shape. The devices of FIGS. 1 and 2 are described further in U.S. Pat. No. 3,596,136 (Fischer). For example, Fischer discloses elliptical, parabolic, and other desired shapes for the glass dome to convey radiation from the diode to a desired receiver in an efficient manner. Fischer also teaches that the glass dome 17 or 17' is, among other things, made of a glass having a high index of refraction, preferably greater than 2 and as close as possible to the index of refraction of the electroluminescent diode, and of a low absorption.

Figure 3:
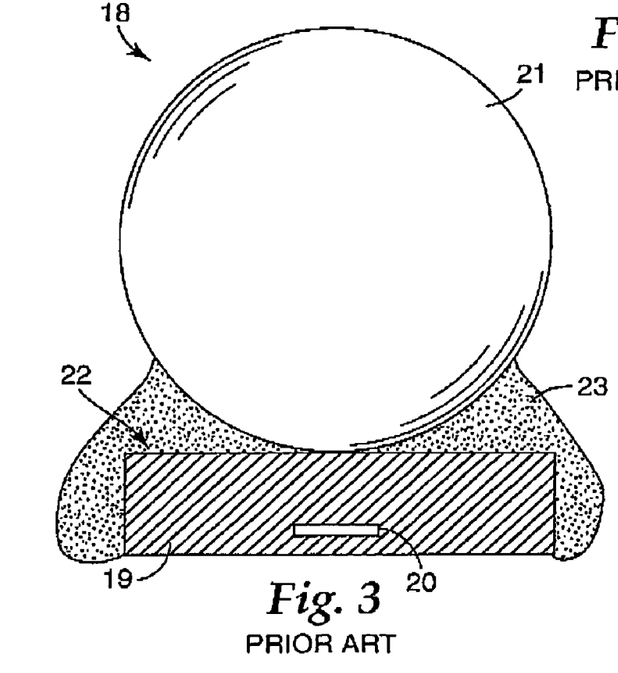

In FIG. 3, a semiconductor light-emitting device 18 is shown. The device 18 includes a semiconductor chip 19 having a narrow light emanating region 20. A spherical lens 21 is mounted on a rear surface 22 of the chip with an ultraviolet hardening adhesive 23. The semiconductor chip 19 is obtained by scribing and dividing a larger semiconductor wafer, and the substrate side of the wafer (later forming the rear surface of chip 19) is ground with high precision to a predetermined thickness such that the distance between the center of the lens 21 and the center of the emanating region 20 is optimum. The device 18 is described further in U.S. Pat. No. 5,403,773 (Nitta et al.). Nitta et al. state that the refractive index of the adhesive resin 23 should be similar to the refractive indices of the device chip 19 and the spherical lens 21.

Figure 4:
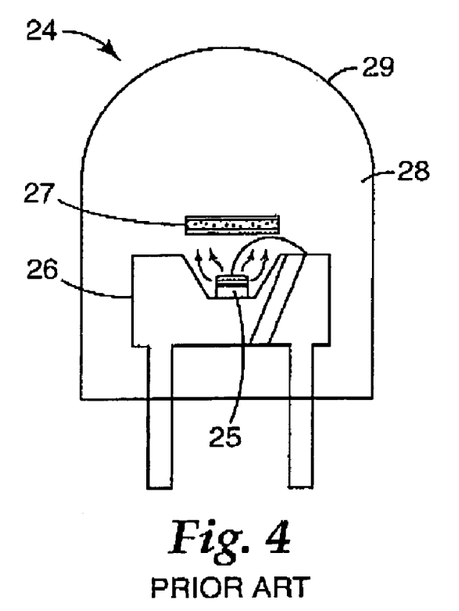

In FIG. 4, an LED-excited phosphor-based light source 24 includes a semiconducting LED 25 mounted in a well of an electrically conductive heat sink 26 that also reflects some of the light emitted from LED 25 toward a phosphor-reflector assembly 27. The assembly 27 can reside in an optically transparent potting material 28 which can be shaped to provide a lens feature 29 to tailor the light emitted by the light source 24. The source 24 is described further in U.S. Application Publication US 2004/0145288 A1 (Ouderkirk et al.).

Figure 5:
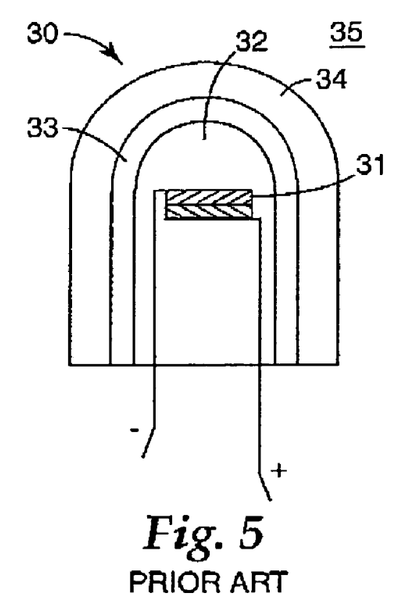

In FIG. 5, a multi-layer LED 30, discussed more fully in U.S. Pat. No. 6,717,362 (Lee et al.), includes a semiconductor material 31 forming a p-n junction diode, the material 31 being encapsulated by three layers 32, 33, 34. The materials of layers 32, 33, 34 are chosen such that the refractive indexes of the layers progressively reduce, from close to that of the semiconductor material 31, to close to that of air 35. According to Lee et al., this results in small refractive index differences between the respective interfaces of the semiconductor material 31 and the first layer 32, the first layer 32 and the second layer 33, the second layer 33 and the third layer 34, and finally the third layer 34 and air 35. Lee et al. teach that any number of layers may be used, as long as the refractive indexes of the layers have the above properties.

BRIEF SUMMARY

The present application discloses, inter alia, an LED light source that includes an LED emitter and an encapsulant at least partially surrounding the emitter. The encapsulant includes an inner lens and an outer lens, the inner lens having a refractive index substantially less than, and preferably 70 to 80% of, the refractive index of the outer lens. The inner and outer lenses can contact each other along a curved surface, corresponding to an outer curved surface of the inner lens and an inner curved surface of the outer lens. Preferably, the inner lens is substantially plano-convex and the outer lens is meniscus. The inner lens produces a first virtual image of the emitter and the outer lens produces a second virtual image, and the first virtual image is disposed between the emitter and the second virtual image. The LED light source is capable of providing uniform illumination in a compact space.

In exemplary embodiments, the curved surface has a radius of curvature, and a distance between an apex of the curved surface and the LED emitter (referred to as $Sag_1$, see FIG. 7 below), that are selected to minimize the volume of the inner lens while encompassing the LED emitter and any wire bonds that may be attached thereto.

In exemplary embodiments, the outer lens has an outer curved surface selected to be substantially aplanatic with respect to the first virtual image. For example, such outer curved surface may be optimized to be aplanatic with respect to an edge portion of the first virtual image, or with respect to an intermediate portion between the edge portion and the center of the first virtual image.

In exemplary embodiments, the LED emitter emits light into the inner lens over a range of polar angles $\theta_S$ from 0 to 90 degrees, and such emitted light exits the outer lens over a range of surface angles $\theta_2$ from 0 degrees to no more than 45 degrees, or from 0 degrees to no more than 30 degrees. With such limited range of exit angles, the surface or Fresnel reflectivity can be effectively reduced by providing a quarter-wave or other suitable anti-reflection coating on the outer surface of the outer lens.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

In the figures, like reference numerals designate like elements.

DETAILED DESCRIPTION OF ILLUSTRATIVE EMBODIMENTS

The present application discloses a compact LED light source utilizing a compound encapsulant lens that forms a virtual image of an LED emitter such as an extended LED die. Preferably, the light source substantially preserves the etendue of the LED emitter in a compact package, so that the light source can be used to effectively illuminate an LCOS panel or other pixilated panel in a mini-projector system.

In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it can be packaged to include a phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant formed over an LED die and an associated reflector cup. The LED die has a quasi-Lambertian emission pattern and much of the light generated within the LED die is trapped due to total internal reflection at the die surface or emitted out of the polymer encapsulant directly above the LED die.

Figure 6:
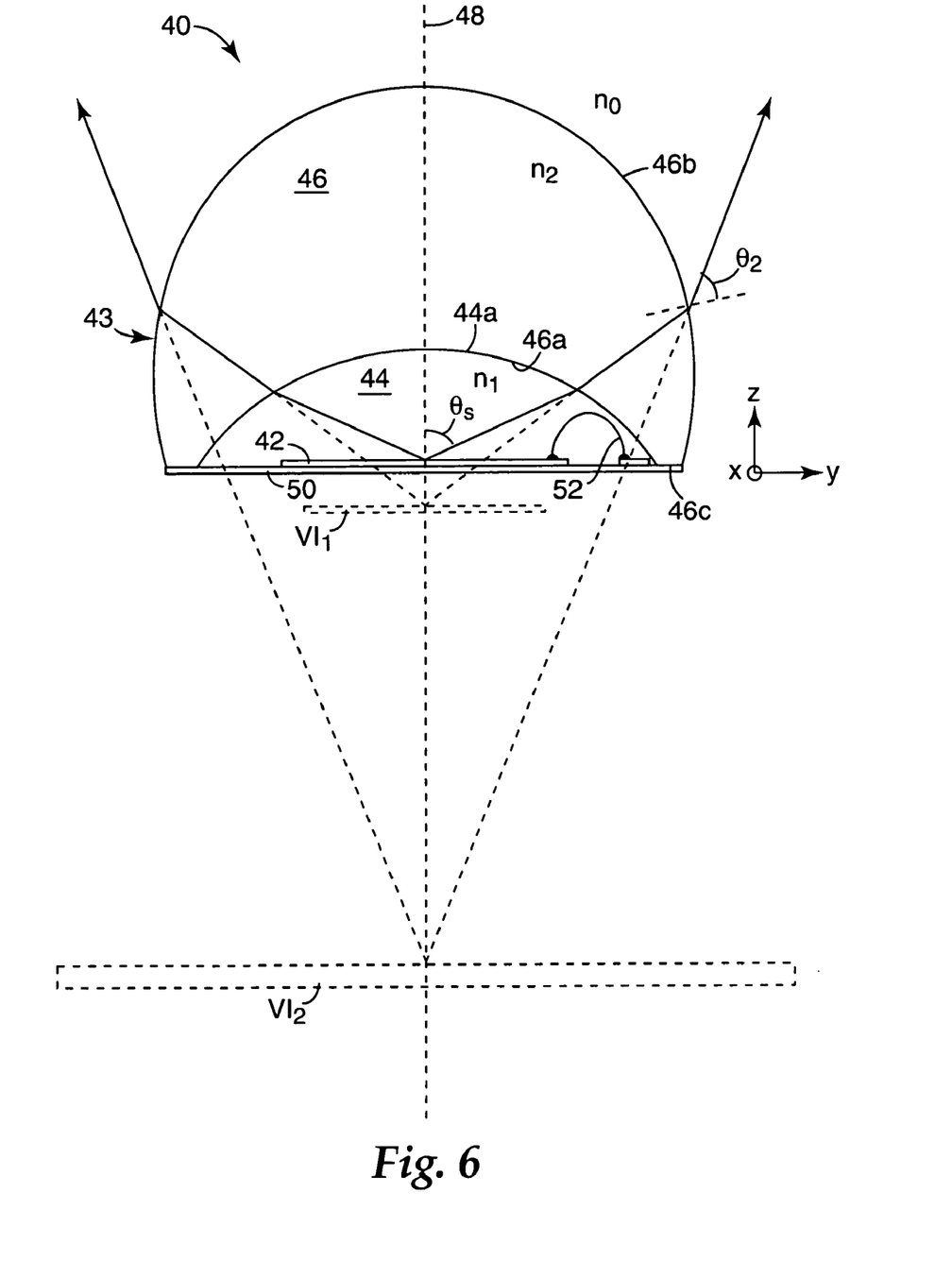
FIG. 6 is a schematic sectional view of an LED light source comprising a compound encapsulant lens.
Figure 7:
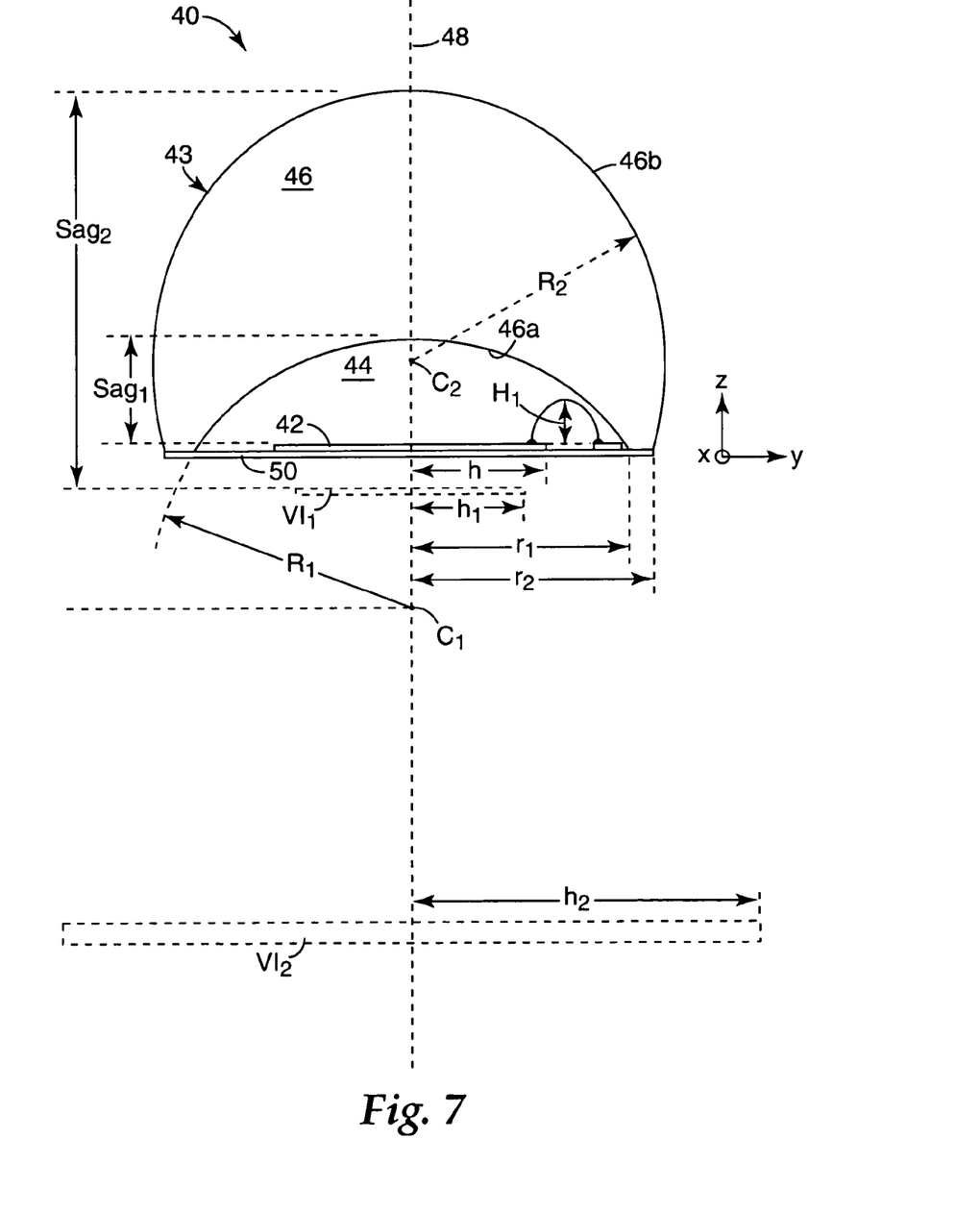
FIG. 7 is another schematic sectional view of the LED light source of FIG. 6.

Turning now to FIG. 6, we see there a light source 40 comprising an LED emitter 42 and an encapsulant 43 that at least partially surrounds the emitter. FIG. 7 depicts the very same light source 40, but identifies additional parameters not shown in FIG. 6 for ease of readability. The LED emitter 42 can be the emitting surface of an LED die or array of dies, or, for example, a thin phosphor layer coated on or otherwise excited by such LED die or dies. Preferably, the emitter 42 substantially lies in a plane, corresponding in FIGS. 6-7 to the x-y plane of a Cartesian xyz coordinate system, but other arrangements are also possible. The emitter 42 is a wide-angle source, and although some light may be trapped within the emitter 42 by total internal reflection, light that emerges into the inner lens 44 is typically distributed over a full half-hemisphere of solid angle, corresponding to a source angle $\theta_S$ (measured with respect to the local surface normal of the emitter, corresponding to the z-axis in FIGS. 6-7) that ranges from 0 to substantially 90 degrees.

The encapsulant 43 is formed of at least two distinct components, and can thus be characterized as a compound encapsulant. Specifically, the encapsulant 43 includes an inner lens 44 and an outer lens 46, each of which have surfaces tailored to converge light emanating from emitter 42. An inner surface of inner lens 44 is preferably in intimate contact with emitter 42, and an outer surface 44a of inner lens 44 is in intimate contact with or substantially mates with an inner surface 46a of outer lens 46. The emitter 42 is thus substantially immersed in the material of the inner lens 44. The outer lens 46 has a curved outer surface 46b exposed to a medium of refractive index $n_0$, typically but not necessarily air. Preferably, the inner and outer lenses 44, 46 are substantially rotationally symmetric about an optical axis 48 of the light source, and the emitter 42 is also preferably centered on the optical axis 48. For source 40, the optical axis 48 is parallel to the Cartesian z-axis.

The refractive indices of the inner and outer lenses, $n_1$ and $n_2$ respectively, are unconventional in the sense that, unlike the teachings of Lee et al. referenced above, they do not progressively decrease as one proceeds from the relatively high refractive index LED emitter 42 to the relatively low refractive index $n_0$ of the surrounding medium. Instead, the refractive index $n_2$ of the outer lens is substantially greater than the refractive index $n_1$ of the inner lens. In this regard, refractive index is measured or evaluated at a suitable wavelength, such as a peak output wavelength of the LED emitter 42, whether red, green, blue, or another visible color. The difference in refractive index is preferably great enough to provide the interface between the inner and outer lenses (i.e., surface 44a or 46a) with sufficient optical power to enable light emitted at a grazing angle from the emitter 42 to exit the outer lens at substantially smaller surface angles, as discussed further below. On the other hand, the difference is preferably not so great that Fresnel reflectivity at the outer surface 46b becomes unacceptable. Thus, the ratio $n_1/n_2$ is preferably less than 0.8, and more preferably in a range from 0.7 to 0.8.

In exemplary embodiments, the inner lens 44 is composed of a light transmissive liquid, gel, or other non-solid material. Such material can be contained or sealed in a space between the inner surface 46a of outer lens 46 and a substrate 50 on which the LED emitter 42 is mounted, and to which outer lens 46 is also attached around a periphery thereof. The substrate 50 may be or comprise a substantially flat piece of ceramic, metal, or other suitable material, and may also comprise other components such as metal contacts, pins, and other conventional structures. In some cases the light source 40 may include one or more wire bonds 52 connecting the LED emitter to one or more metal contacts or pins. If the inner lens is composed of a liquid or gel, thermally-induced stresses on such wire bonds can be minimized. In an alternative embodiment, the inner lens can be composed initially of a liquid UV-curable adhesive or resin such as those available from Norland Products, New Brunswick, N.J., and later cured or otherwise hardened into a solid by the application of UV or other short wavelength radiation. After curing, such resin can operate to hold in place and bond the outer lens 46 to the substrate 50 and to the emitter 42. An exemplary UV-curable adhesive is Norland Optical Adhesive 81 (NOA81). Whether composed of a liquid, gel, resin, or other non-solid or solid light transmissive material, the refractive index $n_1$ of the inner lens is typically in a range from 1.4 to 1.6, often about 1.5, although other values can be used.

In exemplary embodiments, the outer lens 46 is composed of a relatively high refractive index glass or other suitable optical material. Typically, this lens will have a refractive index $n_2$ of at least 1.8, preferably from about 1.9 to 2.1 or about 2. Exemplary materials include sapphire (refractive index 1.77), LASFN9 optical glass (refractive index 1.85), and S-LAH79 optical glass (refractive index 2.003). Outer lens 46 can be cast or molded in the shape shown in FIG. 6, or made in the form of a ball or sphere and then machined to form the inner surface 46a and periphery 46c that preferably contacts the substrate 50.

Optically, as a result of the refractive index differences and the shapes of the curved surfaces, the inner lens 44 converges light from the emitter 42, forming a first virtual image $VI_1$ of the emitter, and the outer lens 46 converges the light still more, forming a second virtual image $VI_2$. The first virtual image is disposed between the LED emitter 42 and the second virtual image. Preferably, the lenses 44, 46 combine to magnify the LED emitter 42 by a factor of 3 to 4, more preferably from 3.5 to 4. Referring to FIG. 7, the maximum in-plane dimension (i.e., the maximum lateral dimension measured in a plane parallel to the x-y plane) of the LED emitter 42, first virtual image $VI_1$, and second virtual image $VI_2$ are two times the labeled dimensions $h$, $h_1$, and $h_2$ respectively. Thus, $h_2/h$ is preferably in a range from 3 to 4. Furthermore, it is preferable that the maximum in-plane dimension of the final virtual image ($VI_2$), which dimension is $2h_2$, is on the order of the maximum in-plane dimension of the outer lens 46. If the outer surface 46b can be fairly characterized by a radius of curvature $R_2$ with a center point $C_2$, this means $2h_2$ is on the order of $2R_2$, for example, $R_2 \leq 2h_2 \leq 4R_2$.

The surfaces 44a, 46a, 46b can be spherical or aspherical, but for economy they are preferably substantially spherical, characterized by a first radius of curvature $R_1$ and center point $C_1$ (for surfaces 44a, 46a) and a second radius of curvature $R_2$ and center point $C_2$ (for surface 46b). If the encapsulant is symmetrical, center points $C_1$ and $C_2$ are disposed on the optical axis 48. Other parameters of interest, shown in FIG. 7, include: the axial distance from the top or front surface of LED emitter 42 to the vertex of surfaces 44a/46a, labeled $Sag_1$; the axial distance from the top or front of the virtual image $VI_1$ to the vertex of outer surface 46b, labeled $Sag_2$; the maximum height of the wire bond 52 relative to the top or front surface of the LED emitter, labeled HI; the maximum in-plane half-width or semi-diameter of the inner lens 44 in the plane of the LED emitter, labeled $r_1$; and the maximum in-plane half-width or semi-diameter of the outer lens 46 in the plane of the LED emitter, labeled $r_2$. To minimize the overall size or volume of the source 40, $r_2$ is preferably selected to be about equal to or only slightly greater than $r_1$.

It is also in many cases desirable to minimize the volume of the inner lens 44 by judicious selection of, for example, $R_1$ and $Sag_1$. When the inner lens is composed of a liquid or gel material, and even in the case of an uncured (liquid) UV adhesive material, minimizing the volume of inner lens 44 can help reduce the occurrence of air bubbles or voids within the lens or between the inner and outer lens, which air bubbles or voids can detrimentally scatter light and reduce image quality. If no wire bonds 52 are present, this selection may force $r_1$, the semi-diameter (in-plane) of the inner lens, to approximately equal h, the maximum half-width of the emitter 42. If a wire bond 52 is present as shown with maximum height $H_1$, the shape of minimum volume will in general be different in order to encompass both the LED emitter 42 and the wire bond(s) 52. In some cases the solution yields a surface 44a (and 46a) for which $Sag_1 \approx 2H_1$.

Rather than minimizing the volume of inner lens 44, one may instead select $R_1$ and $Sag_1$ in order to optimize an optical characteristic of the source 40. For example, $R_1$ and $Sag_1$ may be selected to maximize the magnification of the encapsulant 43.

In some cases, it is also desirable to minimize or at least control the amount of spherical aberration and/or coma in the optical system of the light source. Surfaces 44a, 46a can be made aplanatic (i.e., having little or no spherical aberration or coma) by positioning $C_1$ at the intersection of the optical axis 48 and the LED emitter 42, thus making $Sag_1 \approx R_1$, but this is generally incompatible with minimizing the volume of inner lens 44, and it also reduces or eliminates the converging power of the surfaces 44a, 46a. Therefore, a more desirable way of controlling spherical aberration and coma is to design the outer surface 46b to be aplanatic. For an on-axis point, this can be done by setting the distance between the first virtual image $VI_1$ (which acts as an "object" for purposes of the outer lens) and the vertex of the outer surface 46b to be:

$$Sag_2 \approx R_2 * ((n_0 + n_2)/n_2) \qquad (1)$$

In cases where $n_2$ is about 2 and $n_0$ is 1 (air), this reduces to $$Sag_2 \approx 1.5 * R_2 \qquad (2)$$

Note that the foregoing minimum volume and aplanatic conditions can be used as starting points from which further optimization can be done, such as with conventional optical design software. For example, the outer surface 46b can be designed according to Equation (1) above, and then optimized to minimize spherical aberration and/or coma for far off-axis points at or near the edge of virtual image $VI_1$.

One unexpected benefit of the design discussed in connection with FIGS. 6-7 is the capability to reduce overall Fresnel surface reflections, particularly at the outer surface 46b of the outer lens. "Overall Fresnel surface reflections" in this regard refers to the aggregate or average of all Fresnel surface reflections experienced at the outer surface 46b for light originating from the LED emitter 42 over substantially the entire angular range of emitted light, $0 \leq \theta_S \leq 90$, and for both s- and p-polarization components of incident light at a given point on at the specified interface. At one extreme, an axial light ray emitted from a central portion of emitter 42 in a direction $\theta_S = 0$ (along the optical axis 48) passes undeflected (but partially reflected) through surface 44a, 46a and then impinges on outer surface 46b at an interior surface angle (measured in the outer lens medium $n_2$ relative to the local surface normal) of 0 degrees, and emerges at an exterior surface angle $\theta_2$ (measured in medium no relative to the same local surface normal) of 0 degrees. For such an axial ray, the Fresnel reflectivity at the interface is substantially $((n_2-n_0)/(n_2+n_0))^2$, amounting to about 11% reflectivity when $n_0 \approx 1$ and $n_2 \approx 2$. At the other extreme, a grazing light ray emitted from the LED emitter 42 into the inner lens 44 at a grazing angle $\theta_S \approx 90$ degrees is partially reflected but also deflected at curved surface 44a, 46a depending on the curvature $R_1$ and position ($Sag_1$) of such surface. Thereafter, the deflected ray impinges on outer surface 46b at a point near the periphery 46c and emerges therefrom at a maximum exterior surface angle, $\theta_2 = \theta_{2MAX}$. Note that the Fresnel reflectivity at the maximum surface angle $\theta_{2MAX}$ is, when averaged for the local s- and p-polarization components, significantly higher than the Fresnel reflectivity for normal incidence (for which $\theta_2=0$). If care is not taken in the design of the lenses 44, 46, $\theta_{2MAX}$ may be or approach 90 degrees, and a large amount of light emitted by LED emitter 42 may be lost to Fresnel reflection at the outer surface 46b.

Fortunately, by using an outer lens/inner lens combination where the refractive index of the outer lens is substantially greater than that of the inner lens, and where the outer and inner lenses meet at a suitably curved surface, the maximum surface angle $\theta_{2MAX}$ at the outer surface 46b can be substantially reduced, preferably to 45, 40, 35, or 30 degrees or less, while still maintaining a high magnification imaging system. With such a limited range of surface angles for light exiting the encapsulant, we also have the opportunity to effectively reduce the overall surface or Fresnel reflections even further by providing a quarter-wave or other suitable anti-reflection coating on the outer surface of the outer lens. Such a coating can be effective over substantially the whole limited range of surface angles 0 to 30 or 0 to 45 degrees, whereas it would be much less effective over a much wider range of surface angles (e.g., 0 to about 90 degrees). Notably, if $n_2$ is about 2 and $n_0$ is about 1 (air), then an optimum single layer quarter-wave anti-reflection coating has a refractive index of $\sqrt{(n_2 * n_0)}$, i.e., $\sqrt{2}$ or about 1.4, which advantageously corresponds to the refractive index of magnesium fluoride, a particularly robust and proven optical coating material.

An associated benefit of reducing the range of surface angles at the outer surface 46b of the outer lens 46 is reducing the spherical fraction of the active portion of the outer surface 46b. By this we mean that the active portion of the outer surface 46b, i.e., that portion over which light rays that emanate from the LED emitter over a full hemisphere of solid angle ($0 \leq \theta_S \leq 90$ degrees) exit the outer surface 46b, can be a smaller portion of a complete sphere, or can subtend a smaller solid angle. In fact it is practical for the active portion of the outer surface 46b to be substantially hemispherical (rather than hyperspherical) or less than hemispherical, subtending a solid angle of $2\pi$ steradians or less.

Figure 8:
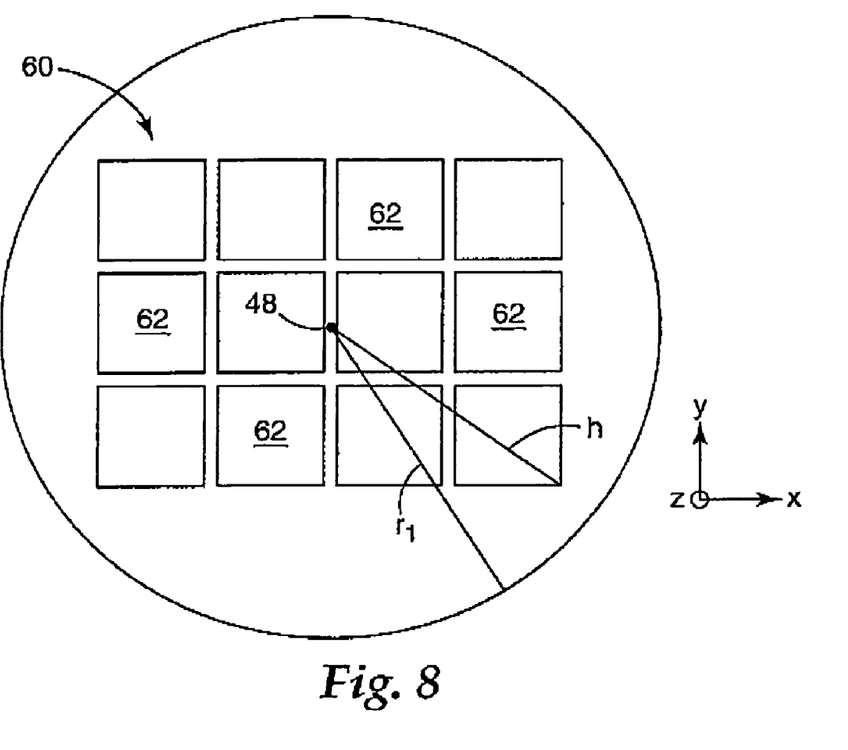
FIG. 8 is a plan view of an array of LED dies forming an exemplary extended LED light source.

Turning now to FIG. 8, we see there a plan view of an exemplary LED emitter 60 contained within a circular boundary of radius $r_1$, the circular boundary corresponding to the intersection of the outer surface 44a of inner lens 44 with the plane of the LED emitter. The LED emitter is extended but discontinuous, made up of a 4×3 array of square LED dies 62 with small gaps therebetween to form a generally rectangular shape whose maximum in-plane dimension is 2h (the distance between opposed corners of the rectangle). The emitter 60 is centered on the optical axis 48.

Given the size of the emitter 60, one wishing to minimize the overall volume or size of the light source may shrink the size of the inner and outer lenses, minimizing at least $r_1$, $r_2$, and $R_2$ (see FIG. 7). However, because of the extended nature of the source and the problem of vignetting, lenses that are too small will cause the virtual image $VI_2$, or any real image formed from the virtual image, to have an unacceptable vignette-related brightness variation across the image, the brightness being maximum in the center of the source (closest to the optical axis) and diminishing to a minimum at the edges or corners of the source (farthest from the optical axis). Increasing the size of the lenses will reduce the vignetting problem, but will also increase the size and weight of the optical system. In the case of ball lenses, keeping the ball diameter $\leq 5$ mm and more preferably $\leq 4$ mm has the practical consequence of increased availability from existing lens manufacturers, and at generally lower prices.

Figure 9:
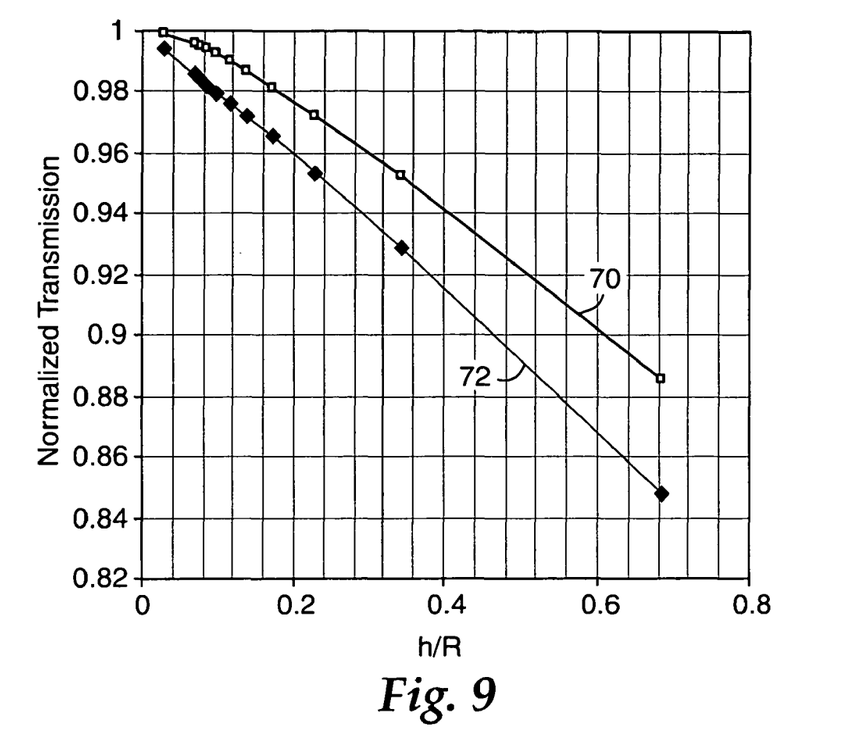
FIG. 9 is a graph of modeled normalized transmission from a light source such as that of FIGS. 6-7 as a function of the half-width of the LED emitter normalized by the radius $R_2$ of the outer surface of the outer lens.

FIG. 9 displays modeling results on a simple but representative optical system used to identify a preferred source-to-lens ratio for purposes of balancing vignetting with lens size, keeping vignetting losses small using a lens that is as small as possible. The model assumed a flat source of zero thickness and maximum in-plane dimension 2h centered on the optical axis, the source immersed in a hemispherical plano-convex lens of radius R and refractive index 1.533, the lens also being centered on the optical axis and surrounded by air. The model launches rays from all areas of the source and in all directions, and calculates what fraction of those rays exit the lens in a direction corresponding to the geometrical or paraxial (virtual) image of the source. This calculated fraction is referred to in FIG. 9 as "normalized transmission". This modeling was done for discrete values of h/R, and also for two characteristic source shapes: a circle of radius h, and a square whose distance from the center of the square to any corner thereof is h. Such sources each have a maximum in-plane dimension of 2h. The normalized transmission for the circular source is shown in curve 70, and that of the square source is shown in curve 72. The curves confirm that as h becomes negligible compared to R (h/R approaches 0), the normalized transmission approaches 1 for both the circular source and the square source. The curves also show that the normalized transmission monotonically decreases as h approaches R (h/R approaches 1). Interestingly, the downward shift of curve 72 (square source) relative to curve 70 (circular source) confirms the fact that image degradation occurs predominantly at the outermost edge or corner of the source. If one selects a minimum tolerable normalized transmission of 0.9 (10% vignetting-related loss), FIG. 9 leads one to select a value h/R of roughly 0.4 or less. In order to keep lens sizes R relatively compact, we select a lower bound for h/R of roughly 0.2 or 0.3. Thus, in a system such as that of FIGS. 6-7, we prefer (but do not necessarily require) that $h/R_2$ is no more than 0.4, preferably in a range from 0.4 to 0.3.

Figure 10:
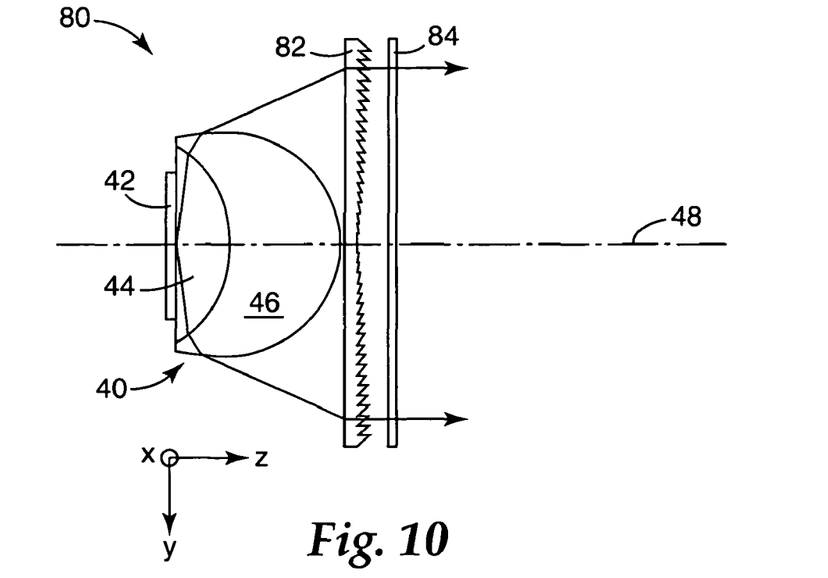
FIG. 10 shows the light source of FIGS. 6-7 with additional optical elements.

The disclosed compact light source can be used in a variety of optical systems, one of which is shown in FIG. 10. In FIG. 10, a miniature collimation system 80 includes the light source 40 described above, as well as an external collimating lens 82 and an optional reflective polarizer 84. Lens 82 is drawn as a segmented or zoned Fresnel lens for reasons of compactness, but any conventional bulk-optic lens or other known lenses can also be used if desired. For collimation, the focal length and position of lens 82 are selected such that the final virtual image IM2 formed by outer lens 46 is disposed at the back focal point of the lens 82. Note that the "collimated" light exiting lens 82 will actually have a nonzero angular spread as a result of the extended nature of the LED emitter 42.

Collimation system 80 also includes an optional reflective polarizer 84. The polarizer can be used to provide linear, circular, or elliptically polarized light as desired. Although an absorbing polarizer can also be used for this purpose, a reflective polarizer, preferably where the "blocked" polarization state is specularly reflected rather than absorbed or scattered, may provide increased efficiency if a structure or mechanism is present in the light source 40 to convert at least some of the blocked polarization state into the orthogonal "pass" state. In fact, the light source described below in the Example has been combined with a collimating lens and coextruded multilayer reflective polarizer of the type described in U.S. Pat. No. 5,882,774 (Jonza et al.), with anti-reflective coatings applied to both sides of the polarizer, and increases in polarized light output of more than 10% (relative to an identical system utilizing an absorbing polarizer rather than the reflective polarizer) have been observed. Exemplary methods of making coextruded multilayered polarizing films are disclosed in U.S. Patent Application Publications US 2002/0180107 A1 (Jackson et al.), US 2002/0190406 A1 (Merrill et al.), US 2004/0099992 A1 (Merrill et al.), and US 2004/0099993 A1 (Jackson et al.). Further exemplary reflective polarizers include Vikuiti™ dual brightness enhancement films (DBEF) available from 3M Company, St. Paul, Minn. Cholesteric polarizers are also contemplated. As mentioned above antireflective coatings can be used on one or both surfaces of the polarizer to minimize losses due to Fresnel surface reflections. Alternatively, the polarizer can be laminated to a smooth preferably flat surface of another optical component such as a lens or plate, or it can be laminated on both sides and sandwiched between two such optical components.

The disclosed compact light source can also be used in projection systems, such as those incorporating a liquid crystal-on-silicon (LCOS) panel or other pixilated panel. An exemplary projection system is disclosed in commonly assigned U.S. Application entitled "Projection System With Beam Homogenizer", filed on even date herewith and incorporated herein by reference.

EXAMPLE

A light source similar to that described in connection with FIGS. 6-7 was fabricated and tested. The light source was constructed from a commercially available Luxeon™ LED white light emitter, type LXHL-PW01, available from Lumileds Lighting, San Jose, Calif. The encapsulant lens supplied with this emitter was removed without damaging the four LED dies, the thin phosphor coating on the front surface of the dies, the substrate on which the dies were mounted, or the wire bonds. These remaining components were left intact and are referred to herein as the "LED base". The four LED dies were rectangular in shape but mounted next to each other to form a nominally square shape in plan view, each side of the square being 1.1 mm in length, but a thin gap was present between each pair of neighboring die. White light was emitted from the (substantially flat) phosphor coating having the same nominally square (but discontinuous) area.

Separately, a 5 mm diameter ball lens made of S-LAH79 glass (refractive index 2.003) was obtained from Edmund Scientific Co., Barrington, N.J. The ball lens was truncated and an inner cavity of radius 2.76 mm was then formed in the truncated area by precision machining. The inner cavity was then filled with uncured (liquid) Norland Optical Adhesive 81 (NOA81), and the resulting structure was placed over the LED base such that the LED dies, phosphor coating, and wire bonds resided in the inner cavity, and an outer periphery of the truncated ball lens (see feature 46c in FIG. 6) contacted the substrate of the LED base. The resulting structure was then exposed to UV light, which served to cure (and solidify) the liquid adhesive, bonding the outer lens to the substrate and LED dies. The resulting light source had an LED emitter (a thin phosphor coating on the surface of the LED dies) and a compound encapsulant lens comprising an inner substantially plano-convex lens composed of a cured UV adhesive and an outer meniscus lens composed of a higher refractive index optical glass. The light source also had the following properties and features:

$n_0 = 1$
$n_1 = 1.53$
$n_2 = 2.003$
$R_1 = 2.76$ mm
$R_2 = 2.5$ mm
$Sag_1 = 1.1$ mm
$Sag_2 = 3.4$ mm
$Sag_2/R_2 = 1.36$
$r_1 = 2.19$ mm
$r_2 = 2.35$ mm
$h = 0.77$
$h/R_2 = 0.31$
$h_2 = 2.58$
$h_2/R_2 = 1$
range of source emitting angle $\theta_S = 0$ to about 90 degrees
range of surface angles $\theta_2$ at outer surface 46b = 0 to about 30 degrees
Magnification of compound encapsulant lens: 3.35

Unless otherwise indicated, all numbers expressing quantities, measurement of properties and so forth used in the specification and claims are to be understood as being modified in all instances by the term "about." Accordingly, unless indicated to the contrary, the numerical parameters set forth in the specification and claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The foregoing description is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention. All patents and patent applications referred to herein are incorporated by reference in their entireties, except to the extent they may be contradictory to the present specification.

The invention claimed is:

1. A light source, comprising:
   an LED emitter having an angular range of emitted light $\theta_s$, where $0° \leq \theta_s \leq 90°$; and
   an encapsulant that at least partially surrounds the LED emitter;
      wherein the encapsulant includes an inner lens and an outer lens that are aligned along an optical axis, the inner lens having a refractive index $n_1$ and an outer convex surface, and the outer lens having a refractive index $n_2 > n_1$, and an inner concave surface that is in contact with the outer convex surface of the inner lens; and wherein the inner lens produces a first virtual image of the LED emitter and the outer lens produces a second virtual image of the first virtual image, the first virtual image being disposed between the LED emitter and the second virtual image.

2. The light source of claim 1, wherein the LED emitter emits wide-angle light from axial to grazing angles into the inner lens, and the inner lens converges and transmits such wide-angle light to the outer lens.

3. The light source of claim 2, wherein the emitted light emerges from the outer lens over a range of surface angles from 0 to $\theta_{2MAX}$, where $\theta_{2MAX}$ is 45 degrees or less.

4. The light source of claim 1, wherein the second virtual image has a magnification relative to the LED emitter in a range from 3 to 4.

5. The light source of claim 1, wherein the LED emitter is substantially planar and has a maximum in-plane dimension of 2 h.

6. The light source of claim 5, wherein the outer lens has an outer curved surface of radius $R_2$, and wherein $h/R_2$ is no greater than 0.4.

7. The light source of claim 6, wherein $h/R_2$ is in a range from 0.3 to 0.4.

8. The light source of claim 1, wherein the outer lens has an outer curved surface that is substantially aplanatic with respect to the first virtual image.

9. The light source of claim 1, wherein the outer lens has an outer curved surface of radius $R_2$, the outer lens being exposed to a medium of refractive index $n_0$, and wherein the first virtual image is disposed at a distance $Sag_2$ from an apex of the outer curved surface of the outer lens, and wherein $Sag_2 \approx R_2*((n_0+n_2)/n_2)$.

10. The light source of claim 1, wherein $n_1/n_2$ is in a range from 0.7 to 0.8.

11. The light source of claim 10, wherein $n_1$ is about 1.5 and $n_2$ is about 2.

12. The light source of claim 1, wherein the inner lens is substantially plano-convex and the outer lens is substantially meniscus.

13. The light source of claim 1, further comprising a substrate on which the LED emitter is mounted, and wherein the inner lens adheres the outer lens to the substrate.

14. The light source of claim 1, wherein the outer lens has an outer curved surface and wherein the light source further comprises an anti-reflection coating on such outer curved surface of the outer lens.

15. The light source of claim 1, wherein the outer convex surface of the inner lens has a radius of curvature $R_1$ and has an apex disposed at a distance $Sag_1$ from the LED emitter, and where $Sag_1$ and $R_1$ are selected to substantially minimize the volume of the inner lens while encompassing the LED emitter and any wire bonds attached thereto.

16. lhe light source of claim 1 and further comprising:
a collimating lens that receives light from the outer lens; and
a polarizer that receives light from the collimating lens.

17. The light source of claim 16 wherein the collimating lens comprises a bulk lens.

18. The light source of claim 16 wherein the collimating lens comprises a Fresnel lens.

19. The light source of claim 16 wherein the polarizer comprises a reflecting polarizer.

20. The light source of claim 19 wherein the reflecting polarizer comprises at least one antireflective coating.

21. A light source, comprising:
an LED emitter having an angular range of emitted light $\theta_s$, where $0° \leq \theta_s \leq 90°$; and
an encapsulant that at least partially surrounds the LED emitter;
wherein the encapsulant includes an inner lens and an outer lens that are aligned along an optical axis, the inner lens having a refractive index $n_1$ and an outer convex surface, and the outer lens having a refractive index $n_2 > n_1$, and an inner concave surface that is in contact with the outer convex surface of the inner lens; and
wherein the inner lens is composed of a non-solid material and the outer lens is composed of a solid material.

22. The light source of claim 21, wherein the inner lens is composed of a light-transmissive liquid or gel.

23. The light source of claim 21, further comprising a substrate on which the LED emitter is mounted, and wherein the non-solid material is contained between the outer lens and the substrate.

24. A light source, comprising:
an LED emitter having angular range of emtitted light $\theta_s$, where $0° \leq \theta_s \leq 90°$; and
an encapsulant that at least partially surrounds the LED emitter;
wherein the encapsulant includes an inner lens and an outer lens that are aligned along an optical axis, the inner lens having a refractive index $n_1$ and an outer convex surface, and the outer lens having a refractive index $n_2 > n_1$, and an inner concave surface that substantially mates with the outer curved surface of the inner lens; and
wherein the emitted light exits the outer lens over a range of surface angles $\theta_2$ from 0 degrees to $\theta_{2MAX}$, where $\theta_{2MAX}$ is no more than 45 degrees.

25. The light source of claim 24, wherein $\theta_{2MAX}$ is no more than 30 degrees.

* * * * *

UNITED STATES PATENT AND TRADEMARK OFFICE
CERTIFICATE OF CORRECTION

PATENT NO. : 7,798,678 B2 Page 1 of 1
APPLICATION NO. : 11/322801
DATED : September 21, 2010
INVENTOR(S) : Patrick Destain It is certified that error appears in the above-identified patent and that said Letters Patent is hereby corrected as shown below:

Column 5
Line 63, delete "HI;" and insert in place thereof --$H_1$;--.

Column 11
Line 6, Claim 2, delete "light," and insert in place thereof --light--.

Column 11
Line 18, Claim 5, delete "2 h." and insert in place thereof --2h.--.

Column 12
Line 3, Claim 16, delete "lhe" and insert in place thereof --The--.

Column 12
Line 35, Claim 24, after "having" insert --an--.

Column 12
Line 35, Claim 24, delete "emtitted" and insert in place thereof --emitted--.

Signed and Sealed this

Seventh Day of December, 2010

David J. Kappos
*Director of the United States Patent and Trademark Office*